(12) United States Patent
Den Boef et al.

(10) Patent No.: US 8,189,195 B2
(45) Date of Patent: May 29, 2012

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Arie Jeffrey Den Boef, Waalre (NL); Hugo Augustinus Joseph Cramer, Eindhoven (NL); Mircea Dusa, Campbell, CA (US); Irwan Dani Setija, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 1143 days.

(21) Appl. No.: 11/798,039

(22) Filed: May 9, 2007

(65) Prior Publication Data
US 2008/0279442 A1 Nov. 13, 2008

(51) Int. Cl.
*G01B 11/00* (2006.01)
*G01B 11/14* (2006.01)
*G01B 11/04* (2006.01)
*G01N 21/00* (2006.01)

(52) U.S. Cl. ........... 356/400; 356/237.5; 356/614; 356/625; 356/636

(58) Field of Classification Search ............ None
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,128,067 A * | 10/2000 | Hashimoto | 355/52 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |

(Continued)

FOREIGN PATENT DOCUMENTS
EP 1 628 164 A2 2/2006
(Continued)

OTHER PUBLICATIONS

English-Language Abstract for Japanese Patent Publication No. 2003-162041 A, published Jun. 6, 2003; 1 page.

(Continued)

*Primary Examiner* — Tarifur Chowdhury
*Assistant Examiner* — Gordon Stock, Jr.
(74) *Attorney, Agent, or Firm* — Sterne, Kessler, Goldstein & Fox P.L.L.C

(57) ABSTRACT

A method of measuring a property of a substrate includes generating a patterned mask configured to cause a radiation beam passing through the mask to acquire the pattern, simulating radiating the substrate with a patterned radiation beam that has been patterned using the mask to obtain a simulated pattern, determining at least one location of the simulated pattern that is prone to patterning errors, and irradiating the substrate with the patterned radiation beam using a lithographic process. The method also includes measuring an accuracy of at least one property of the at least one location of the pattern on the substrate that has been determined as being prone to patterning errors, and adjusting the lithographic process according to the measuring.

33 Claims, 4 Drawing Sheets

U.S. PATENT DOCUMENTS

| | | | | |
|---|---|---|---|---|
| 6,856,408 B2 | 2/2005 | Raymond | | 356/601 |
| 6,919,964 B2 | 7/2005 | Chu | | 356/601 |
| 6,928,628 B2 | 8/2005 | Seligson et al. | | 716/4 |
| 6,940,592 B2 * | 9/2005 | Borden et al. | | 356/326 |
| 6,952,818 B2 | 10/2005 | Ikeuchi | | |
| 6,972,852 B2 | 12/2005 | Opsal et al. | | 356/625 |
| 6,974,962 B2 | 12/2005 | Brill et al. | | 250/548 |
| 6,987,572 B2 | 1/2006 | Lakkapragada et al. | | 356/601 |
| 6,998,217 B2 * | 2/2006 | Martyniuk et al. | | 430/296 |
| 7,046,376 B2 | 5/2006 | Sezginer | | 356/601 |
| 7,061,615 B1 | 6/2006 | Lowe-Webb | | 356/401 |
| 7,061,623 B2 | 6/2006 | Davidson | | 356/497 |
| 7,061,627 B2 | 6/2006 | Opsal et al. | | 356/601 |
| 7,068,363 B2 | 6/2006 | Bevis et al. | | 356/237.5 |
| 7,148,959 B2 | 12/2006 | Dusa et al. | | |
| 7,844,939 B2 * | 11/2010 | Tsutsui et al. | | 716/55 |
| 2004/0119970 A1 * | 6/2004 | Dusa et al. | | 356/237.1 |
| 2004/0169859 A1 | 9/2004 | Smith | | 356/369 |
| 2005/0157350 A1 * | 7/2005 | Lee et al. | | 358/474 |
| 2005/0185174 A1 | 8/2005 | Laan et al. | | 356/243.1 |
| 2006/0033921 A1 * | 2/2006 | Den Boef et al. | | 356/446 |
| 2006/0066855 A1 | 3/2006 | Boef et al. | | 356/401 |
| 2006/0126074 A1 | 6/2006 | Van Der Werf et al. | | 356/489 |
| 2006/0139592 A1 | 6/2006 | Den Boef et al. | | 355/53 |
| 2006/0164649 A1 * | 7/2006 | Rosengaus | | 356/450 |
| 2006/0164657 A1 * | 7/2006 | Chalmers et al. | | 356/630 |
| 2007/0002336 A1 * | 1/2007 | Pellemans et al. | | 356/625 |
| 2009/0212212 A1 * | 8/2009 | Shishido et al. | | 250/307 |
| 2010/0328636 A1 * | 12/2010 | Quaedackers et al. | | 355/53 |

FOREIGN PATENT DOCUMENTS

| | | |
|---|---|---|
| EP | 1 628 164 A3 | 4/2006 |
| JP | 2003-162041 A | 6/2003 |
| JP | 2004-287400 A | 10/2004 |

OTHER PUBLICATIONS

English-Language Abstract for Japanese Patent Publication No. 2004-287400 A, published Oct. 14, 2004; 1 page.

English-Language Translation of Notice of Reasons for Rejection directed to related Japanese Patent Application No. 2008-120101, mailed Oct. 21, 2011, from the Japanese Patent Office, 3 pages.

* cited by examiner

A

B

C

D

INSPECTION METHOD AND APPARATUS, LITHOGRAPHIC APPARATUS, LITHOGRAPHIC PROCESSING CELL AND DEVICE MANUFACTURING METHOD

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example, the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

A test structure on a substrate is often measured using the above apparatus in order to test the accuracy of a lithographic process. Following the lithographic process, an inspection tool is used that comprises at least in part a scatterometer as described above. The test structure may be an array of bars that form a grating. Alternatively, the patterned product itself may be inspected during the production of the plurality of product layers. The inspection tool may then be used in-line to ensure that each layer or each set of layers is meeting quality specifications. The features of the patterned product that are determined using the inspection tool may be: overlay (i.e. the extent to which subsequent layers of patterned product "line up") and size and shape parameters of the patterns such as critical dimension (CD), height of a patterned product in a single or multiple layers, and sidewall angle (which is the angle between the layer surface and the rising side of the product).

United States Patent Application Publication No. 2004/0169859 A1 (Smith) describes a method and apparatus for scatterometry measurements as described above. It describes the use of libraries of predicted measurements and specifically, it describes a way a theoretical model of a structure is parameterized to allow the characteristics of the structure to be independently measured. The parameters of the physical structure are varied over a predetermined range and the theoretical spectral result for each variation to the physical structure is calculated to define a library of spectra for the variable structure. Then, when (spectral) measurements of a presently measured physical structure are obtained, the library is searched to find the best fit. The characteristics of the presently measured physical structure may then be determined as closely as possible within the tolerances allowed by the results in the library. Alternatively, the library data may be used as a starting point and an estimation of an interpolation algorithm is used to refine the results such that a closest fit to the presently detected physical structure is found.

Untied States Patent Application Publication No. 2004/0169859 further describes a way of increasing measurement sensitivity (and possibly permitting measurements with higher spatial resolution) by introducing the periodical excitation of the physical structure with an intensity modulated pump beam. A second probe beam is directed to overlap at least a portion of the area which is being periodically excited. The combination of the modulated beam and the probe beam then gives an output at a detector that can be processed in a manner to extract the modulated portion of the signal the features. Specifically, a narrow wavelength beam from a laser that can be focused on a smaller spot may be used in combination with a broader polychromatic beam, thereby allowing a small spot measurement but over a range of wavelengths.

This method is known as modulated scatterometry. Modulated scatterometry is a pump-probe concept: a pump beam excites the substrate and the probe beam measures the change in a substrate property that is induced by the pump beam. A change in property can be very diverse. In its simplest form it is, for example, a reflectance variation. However, pump beams tend to alter a property of the substrate and are not useful for in-line measurement.

Nothing has been found in the prior art that discloses how to ensure that the correct portion of the physical structure on a substrate is being detected. In other words, although a measurement beam's spot size may be reduced, the accuracy of its position relative to a pattern on the substrate does not increase correspondingly. This accuracy may be particularly important if the physical structure is a pattern that is not periodic. Measurements from the wrong area of a non-periodic structure or pattern may give rise to a diffraction spectrum that may not necessarily match diffraction spectra existing in predetermined libraries. Errors may thereby be detected that are not, in fact, errors in the printing of the structure, but may be merely errors in alignment of the measurement beam. Alternatively, if the measured spectrum does match a stored spectrum but the position of the measured portion is incorrect, errors in the printing of the pattern may go unnoticed.

SUMMARY

It is desirable to provide a method and an apparatus for accurately determining the location on a patterned substrate from which a measurement of an image of the pattern is being obtained. It is also desirable to determine locations on a patterned substrate that are most likely to have errors in order to increase the likelihood of finding errors, should there be any, in a lithographic process.

In general, according to an aspect of the invention, there is provided an optical technique to determine the position of a measurement spot with respect to a known hot spot or a non-periodic pattern on a substrate using the combination of acquiring a large series of spectra for various measurement spot positions in the neighborhood of a hot spot and the use of a pattern-matching method to compare the large series of spectra with pre-calculated spectra in a library. Once the position of the measurement spot is known, this position is inputted into a system that reconstructs the pattern at the measurement spot using standard scatterometry techniques.

According to an aspect of the invention, there is provided a method of measuring a property of a substrate. The method includes generating a patterned mask configured to cause a radiation beam passing through the mask to acquire the pattern; simulating irradiating the substrate with a patterned radiation beam that has been patterned using the mask to obtain a simulated pattern; determining at least one location of the simulated pattern that is prone to patterning errors; irradiating the substrate with the patterned radiation beam using a lithographic process; measuring an accuracy of at least one property of the at least one location of the pattern on the substrate that has been determined as being prone to patterning errors; and adjusting the lithographic process according to the measuring.

According to another aspect of the invention, there is provided an inspection apparatus configured to measure a property of a substrate. The inspection apparatus includes a first radiation source configured to irradiate a measurement spot on a patterned target of a substrate; a second radiation source configured to irradiate an area of the patterned target that is larger than the measurement spot; a first detector configured to detect radiation having been diffracted from the measurement spot and radiation having been reflected from the area of the patterned target, and to output an image of the relative positions of the measurement spot and the area of the patterned target; an image processor configured to receive the output of the first detector, to compare the position of the measurement spot with respect to the area of the patterned target, and to output a value of the position of the measurement spot relative to the area of the patterned target; a second detector configured to detect radiation from the first radiation source having been diffracted from the measurement spot, and to output a diffraction spectrum corresponding to the patterned target; and a processor configured to process the output of the image processor and the output of the second detector to reconstruct the pattern of the patterned target within the measurement spot.

According to another aspect of the invention, there is provided a lithographic apparatus configured to measure a property of a substrate. The lithographic apparatus includes a first radiation source configured to irradiate a measurement spot on a patterned target of a substrate; a second radiation source configured to irradiate an area of the patterned target that is larger than the measurement spot; a first detector configured to detect radiation having been diffracted from the measurement spot and radiation having been reflected from the area of the patterned target, and to output an image of the relative positions of the measurement spot and the area of the patterned target; an image processor configured to receive the output of the first detector, to compare the position of the measurement spot with respect to the area of the patterned target, and to output a value of the position of the measurement spot relative to the area of the patterned target; a second detector configured to detect radiation from the first radiation source having been diffracted from the measurement spot, and to output a diffraction spectrum corresponding to the patterned target; and a processor configured to process the output of the image processor and the output of the second detector to reconstruct the pattern of the patterned target within the measurement spot.

According to another aspect of the invention, there is provided a lithographic cell configured to measure a property of a substrate. The lithographic cell includes a first radiation source configured to irradiate a measurement spot on a patterned target of a substrate; a second radiation source configured to irradiate an area of the patterned target that is larger than the measurement spot; a first detector configured to detect radiation having been diffracted from the measurement spot and radiation having been reflected from the area of the patterned target, and to output an image of the relative positions of the measurement spot and the area of the patterned target; an image processor configured to receive the output of the first detector, to compare the position of the measurement spot with respect to the area of the patterned target, and to output a value of the position of the measurement spot relative to the area of the patterned target; a second detector configured to detect radiation from the first radiation source having been diffracted from the measurement spot, and to output a diffraction spectrum corresponding to the patterned target; and a processor configured to process the output of the image processor and the output of the second detector to reconstruct the pattern of the patterned target within the measurement spot.

By "within the measurement spot", it is understood that the reconstruction may occur in the patterned area that is covered by the entire measurement spot. This is because the measurement spot is not sharply defined. It can, for example, be a so-called Airy disc, i.e., a central spot with many side lobes that extend away from the central spot. The entire target that falls within the central spot and an appreciable portion of the side lobes may affect the spectrum and can thus potentially be reconstructed.

According to another aspect of the invention, there is provided a method of measuring a property of a substrate. The method includes irradiating a measurement spot on a patterned target on a substrate with a first radiation source; irradiating, with a second radiation source, a portion of the patterned target on the substrate that is larger than the measurement spot irradiated by the first radiation source; detecting radiation that is reflected from the measurement spot and the portion of the patterned target with a first detector and outputting an image of the relative positions of the measurement spot and the portion of the patterned target; comparing the position of the measurement spot with respect to the portion of the patterned target outputting a value of the position of the measurement spot relative to the portion of the patterned target; detecting radiation from the first radiation source having been diffracted from the measurement spot using a second detector and outputting a spectrum of the diffraction pattern associated with the patterned target; and reconstructing the pattern of the patterned target within the measurement spot using the image of the patterned target and the value of the position of the measurement spot relative to the portion of the patterned target.

According to a further aspect of the invention, a device manufacturing method is provided. The method includes simulating radiating a substrate with a patterned radiation beam that has been patterned with a patterning device to obtain a simulated pattern; determining at least one location of the simulated pattern that is prone to patterning errors; irradiating the substrate with the patterned radiation beam using a lithographic process; measuring an accuracy of at least one property of the at least one location of the pattern on the substrate that has been determined as being prone to patterning errors; and adjusting the lithographic process according to the measuring.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
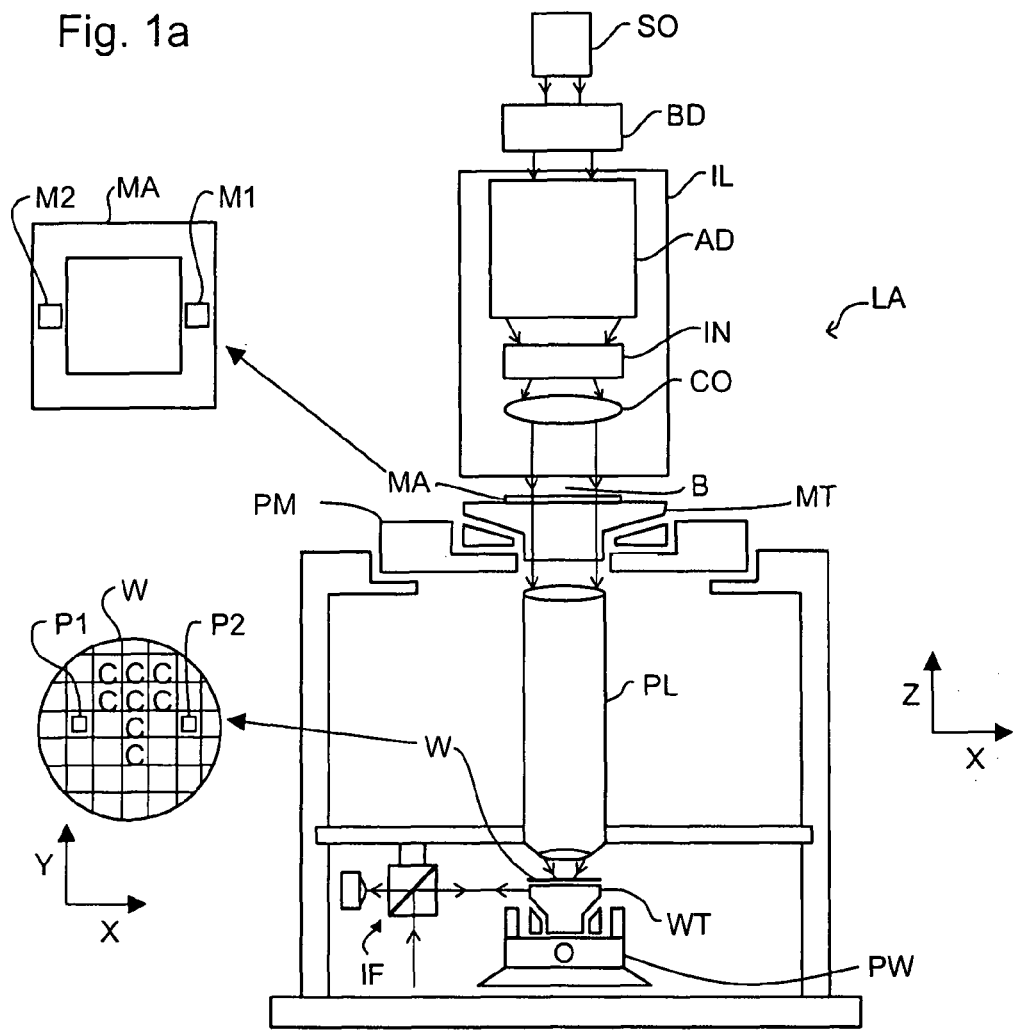
FIG. 1a depicts a lithographic apparatus.

FIG. 1a schematically depicts a lithographic apparatus according to an embodiment. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example, when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
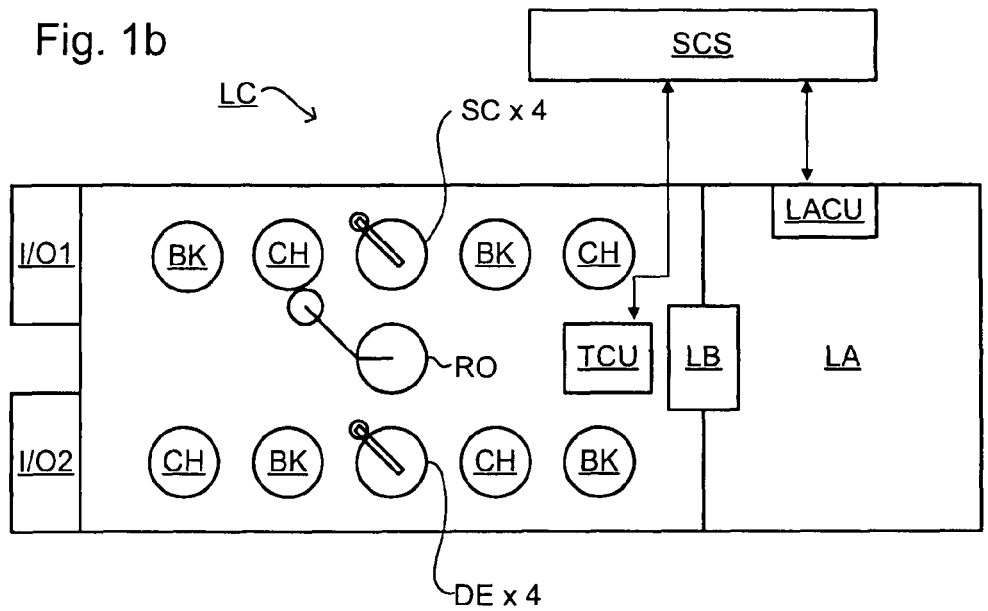
FIG. 1b depicts a lithographic cell or cluster.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already-exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, i.e., there is only a very small difference in refractive index between the parts of the resist which have been exposed to radiation and those which have not, and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 2:
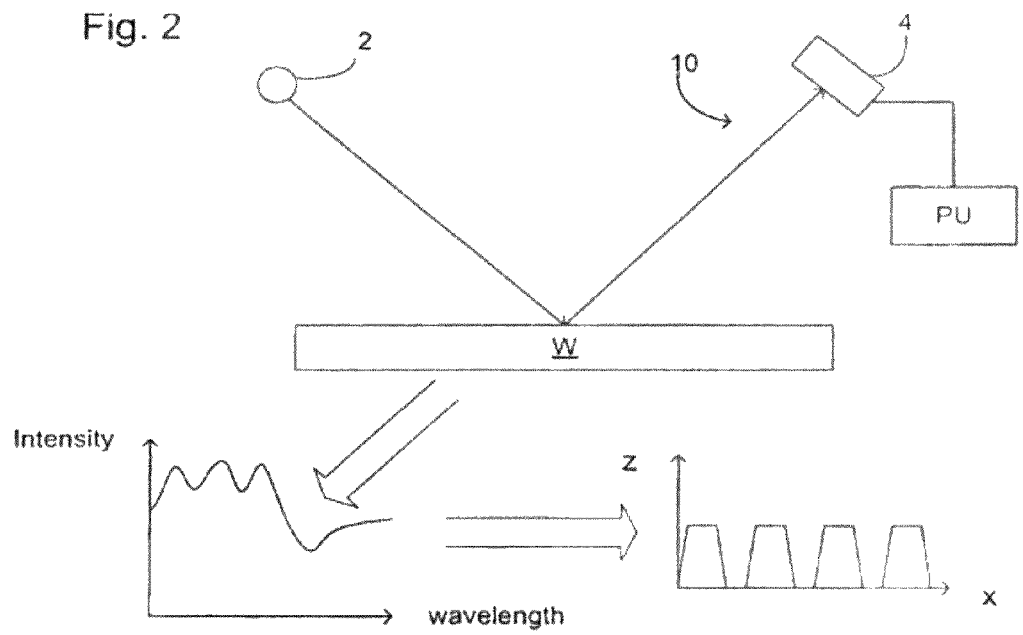
FIG. 2 depicts a first scatterometer.

FIG. 2 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer (e.g. ellipsometer).

Figure 3:
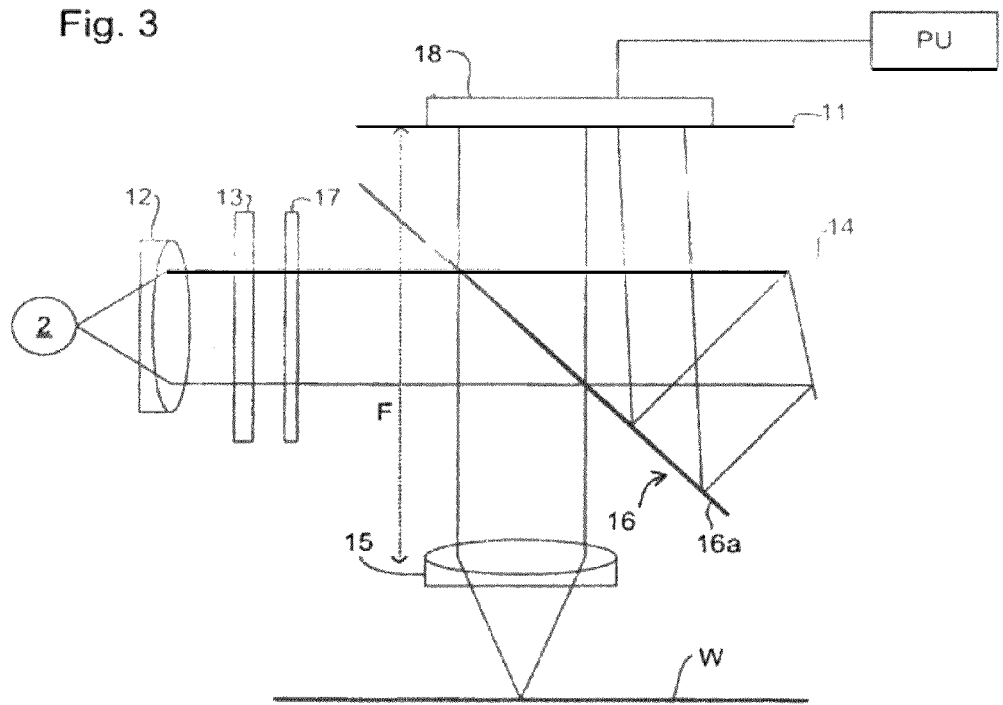
FIG. 3 depicts a second scatterometer.

Another scatterometer that may be used with the present invention is shown in FIG. 3. In this device, the radiation emitted by radiation source 2 is focused using lens system 12 through interference filter 13 and polarizer 17, reflected by partially reflective surface 16a of a beam splitter 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16a into a detector 18 in order to have the scatter spectrum detected. The detector may be located in the back-projected pupil plane 11, which is at the focal length F of the lens system 15. However, the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 16, part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength, angles of incidence and azimuthal angles) can be measured, which contains more information than a 2-D spectrum. This allows more information to be measured which increases metrology process robustness. This is described in more detail in European Patent Application Publication No. 1,628,164A.

The target on substrate W may be a grating, which is printed such that after development, the bars are formed of solid resist lines. The bars may alternatively be etched into the substrate. This pattern may, for example, be made sensitive to aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, obtained by processing unit PU may, for instance, be used to determine focus and dose of the lithographic tool from knowledge of the printing step.

When the pattern of the target is not periodic such as the gratings described above, but comprises for example a product shape that has many different configurations, it is the position of the pattern from which the measurement of any parameter is taken that should be as accurate as possible. For example, as shown in Figure, if a measurement spot is assumed to be in position A but is in fact in position B, a spectrum detected by a normal scatterometer or ellipsometer will find a structure that does not match the expected structure at A. Corrections might therefore be made to the printing process (or other pre- or post-exposure processes that has an effect on the shape of the pattern) to change the structure feature at B so that it resembles that at A, thereby potentially causing considerable errors or, at the very minimum, creating unnecessary work and slowing down through-put of the patterned substrates.

Measurement of the pattern on a substrate is not required for the entirety of the pattern. However, for quality control or for a specific problem area, several measurements should be made in order to monitor and maintain the desired accuracy. Specific pattern areas are identified that have a small process latitude (i.e. areas that are sensitive to errors in a lithography or a patterning process). These specific pattern areas are called lithography "hot-spots". If a known hot-spot exists, there should be a higher density of measurement spots in the area of the known hot-spot in order to monitor the area and ensure that errors are not occurring. Hot-spots generally take the form of variations in 2-dimensional pattern shape and dimension, and their magnitude may vary. Hot-spots are sensitive to variations in focus and dose of the lithographic and other processes, as well as to vibrations in the apparatus during the processes. Hot-spots are rarely periodic and so they cannot be measured with classical scatterometry techniques that only work on periodic patterns. In order to perform scatterometry on non-periodic patterns, the exact position of the measurement (or inspection) beam should be known.

Memory structures are largely periodic and "logic" structures (micro-processors) are non-periodic. However, there is a tendency in IC design to make even "logic" circuit features as periodic as possible since this improves printability in the lithography step. The location with the lowest process window (i.e. the "hot spot") in a periodic structure is often the edge of the structure where the periodicity ends and it is therefore best to measure the edge of a periodic structure since this edge is most susceptible to variations in the lithography process.

The position of the hot-spot may be determined using a method as follows. A mask that has a specific, known pattern is generated. A simulation of the use of the mask is carried out using software, for example. The simulation of the use of the mask by extrapolating how the mask pattern will cause a radiation beam to pattern a substrate gives rise to a simulated pattern or a simulated target of the substrate. By simulating how the radiation beam will react upon passage via the mask, the areas that are prone to errors can be determined. This can be confirmed by actually irradiating a substrate using the mask and observing the simulated error-prone areas or hot-spots with scanning electron microscopes or other observational tools.

Once the simulation has been carried out and the hot-spots determined, a lithographic process using a lithographic apparatus as described above may be carried out to actually irradiate the substrate with the pattern using the mask. The hot-spot estimates may then be transferred to the substrate and those locations measured for errors. If errors are found, the mask or the lithographic process may be adjusted to compensate for or correct those errors.

This may have the advantage of reducing the locations on the pattern that are checked for errors, as only the locations most likely to have errors should errors occur are checked. If large errors are found, for instance, further locations may be observed.

There are several ways in which the measurement of the hot-spots may be carried out once their likely locations have been determined.

In a "design for manufacturing" approach, scanning electron microscopy (SEM) images are created up-front in the design and calibration phase. In the actual measurement phase, SEM can then be used to inspect hot-spot areas that are most sensitive to errors. In this approach, lithography simulations are used to calculate critical pattern responses to various processing variations. Process-distorted pattern shapes and dimensions are thereby predicted. One potential problem with this is that SEM is typically very slow and expensive. Therefore, it may not be possible to use a scanning electron microscope to inspect every substrate location where a potential hot-spot exists, and it is especially undesirable for in-line measurements where throughput of the substrates may be greatly affected. Furthermore, SEM sometimes affects pattern shape during the very inspection intended to find pattern shape errors. Such potential drawbacks may be overcome by using a system such as that shown in FIG. 4.

Figure 4:
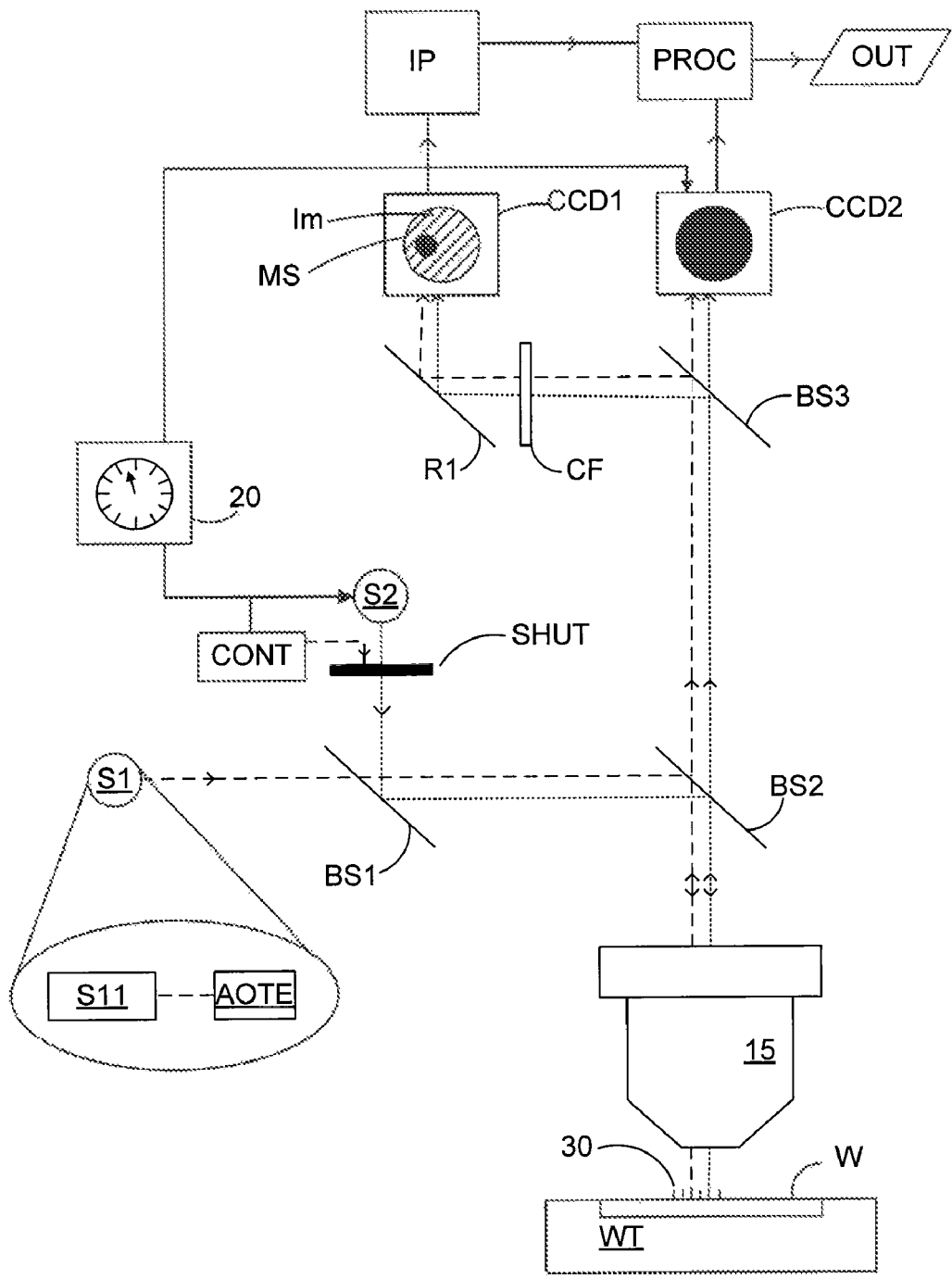
FIG. 4 depicts a measurement spot measuring apparatus according to an embodiment of the present invention.

A scatterometer such as that described above may be used. As shown in FIG. 4, a first light source S1 is diffracted from a pattern 30 on a substrate W, the substrate W being supported by a substrate table WT. The diffracted light from the pattern surface is then detected by a detector CCD2, which as a result detects the diffraction spectrum for the area illuminated by the first source S1. This is a standard scatterometric measurement. The first light source S1 is the source that will create the measurement beam. The density or complexity of the structures in the area around the hot-spots will determine the locations where a spectrum must be measured. A standard number and density of measurements may be used based on known likelihood of hot-spots in specific locations, or the number of measurements may be adapted on a case-by-case basis.

The first light source S1 is preferably a laser in order to obtain as small (and therefore precise) a measurement spot as possible. However, the measurement spot may also be limited by the diffraction it undergoes upon reaching the patterned target and so practically, the diameter of the measurement spot should be of the order of about 300 nm. As lasers tend to be monochromatic such that the available number of wavelengths of radiation available for the measurement is limited, the laser used is preferably a tunable laser in order to create as large a number of different wavelengths as possible. Obviously, a larger amount of measurement data for each measurement spot gives greater accuracy for that spot. To this end, the first source S1 preferably has a range of wavelengths using an acousto-optic tunable filter (AOTF), described below, and creates a range of angle-resolved spectra for a single measurement spot. In the case of the use of ellipsometry, polarizers are preferably used to create measurement data for at least two orthogonal orientations of polarization of the incident light beam to obtain more precise measurements.

The tunable laser S1 may take the form of a super continuum laser and an acousto-optic tunable filter (AOTF). The source S1 comprises a broadband source S11, such as for example a xenon lamp or a super continuum laser, which directs light into an acousto-optical tunable filter (AOTF) which is used to select a narrow range of wavelengths from the broadband (white light) output of the source S11 to form the inspection beam in the scatterometer.

The acousto-optical tunable filter comprises an acousto-optical crystal to which are connected a piezoelectric transducer driven by a high-frequency driver circuit and an acoustic absorber. The transducer creates acoustic waves in the crystal with a wavelength determined by the mechanical properties (speed of sound) of the crystal and driving frequencies. As these waves propagate through the crystal, they form a periodic redistribution of the refractive index of the crystal due to the alternating expansion and contraction of the crystal lattice. This forms a diffraction grating that diffracts the light passing through it, although diffraction occurs throughout the region of interaction rather than at a single point and only radiation meeting phase and/or momentum matching conditions is diffracted. The net effect is that radiation of a narrow band of wavelengths is diffracted away from the main beam and can be selected by a spatial and/or polarizing filter. The center wavelength of the diffracted beam is dependent on the driving frequency of the transducer, so it can be controlled within quite a wide range and very rapidly, dependent on the response time of the driver circuit, the transducer and the crystal. The intensity of the diffracted beam is also controlled by the intensity of the acoustic waves.

Suitable materials which can be used for the acousto-optical crystal include: Quartz ($SiO_2$), KDP ($KH_2PO_4$), Paratellurite or tellurium dioxide ($TeO_2$), $LiNbO_3$, calomel or mercuric chloride ($Hg_2Cl_2$), TAS ($Ta_3AsSe_3$) and Te (tellurium), magnesium fluoride (MgF), and sapphire (aluminum oxide, $Al_2O_3$). The crystal selected determines the detailed geometry of the acousto-optical tunable filter. If a birefringent crystal is used, the filter may also select a particular polarization state.

The transducer is connected to the control unit of the scatterometer which provides a drive signal to cause the transducer to emit acoustic waves of an appropriate frequency to select a narrow band of wavelengths centered on a desired wavelength, as required for a given measurement. The bandwidth of the transmitted beam is preferably less that 20 nm, less than 15 nm, less than 10 nm or less than 5 nm. The exact relationship between frequency of drive signal and selected wavelength depends on the particular crystal employed and the geometry of the device. In some cases, by applying a drive signal having two or more components of different frequencies $\Omega_1$ to $\Omega_n$, the filter can be operated to select a plurality of components each centered around a different wavelength, which forms a polychromatic beam that allows a plurality of measurements to be made simultaneously. The intensities of the different frequency components of the drive signal can be varied to individually control the intensities of the different wavelengths in the polychromatic beam.

A potential advantage of the use of an acousto-optical tunable filter is that, due to its fast response time, it can be used to reduce noise in the measurement beam, especially when a super continuum laser is used as the light source. The AOTF can also be used to rapidly switch off the light so that it acts as a shutter. This may be advantageous because the best cameras for scatterometry are frame transfer CCD cameras that need a very fast shutter to block the light during charge transport of the accumulated carriers.

However, the use of the laser S1 on its own is not sufficient for determining the exact position of the measurement spot created on the patterned target. Various methods may be employed to determine the position of the measurement spot in relation to the substrate table WT or even the substrate by use of sensors and other alignment monitors. However, it is difficult to determine the exact position of the measurement spot with respect to the pattern that is on the substrate. The reason for this is that although the spectrum that results from the diffraction of the laser light on the measurement spot may be detected, especially if the pattern is non-periodic, it may be very difficult to determine exactly what feature of the pattern's structure is being imaged in the detector CCD2 (though, of course, the pattern is not imaged on CCD2 but the scatter spectrum that is scattered by the pattern is imaged on the CCD2) and whether, if the spectrum does not match what is expected, the pattern structure is flawed, or the position of the measurement is flawed.

One aim of the apparatus as shown in FIG. 4 is to be able to compare the spectrum resulting from a measurement spot with a library of spectra that have been calculated for various locations of the measurement spot on the hot-spot. The library contains each parameter for the structures of the pattern and the relative position of the hot-spot with respect to the measurement spot.

A structure of the pattern may be as small as 30 to 40 nm, whereas the measurement spot is an order of magnitude greater. There are therefore many parameters that may be present in a single measurement spot. Of course, the structure may have a CD that is greater than the spot size A shown in FIG. 5, in which case knowledge of the exact position of the spot size is invaluable.

In order to be able to determine exactly where in the printed pattern the measurement beam from the first source S1 is diffracted from, a second light source S2 is introduced. The second light source S2 is preferably a light emitting diode (LED) or other extended light source that serves to illuminate a structure of the pattern around the measurement spot. The light source S2 is preferably a white-light LED in order to supply as many wavelengths of light as possible. A color filter CF may be used in conjunction with the white-light LED eventually to allow only the desired frequencies to the image detector CCD1. The size of the area illuminated by the second source S2 is greater than the measurement spot, but overlaps with the measurement spot such that the measurement spot illuminates a fraction of the illuminated area. The position of the measurement spot with respect to the area illuminated by the light source S2 is determined. This is done by the imaging of both the illuminated spot and the illuminated area in the same detector CCD1 as described below.

As shown in FIG. 4, a partial reflector BS1 combines the radiation beams from the first and second radiation sources S1 and S2 and deflects them using a second partial reflector BS2 via a high numerical aperture (NA) objective 15 onto the surface of the substrate W. The light is then reflected from the surface of the substrate and travels back through the second partial reflector BS2 where it is split at a beam splitter BS3 such that different parts of the beam will be detected by two different detectors CCD1 and CCD2. An image processor IP is configured to receive the output of the first detector CCD1 and to provide output to a processor PROC. Processor PROC is configured to process the output of the image processor IP and the output of the second detector CCD2 and to produce output OUT. A reflector R1 may be used at any position to make the apparatus more compact by effectively folding the light path. When the radiation beams reflect from a part of the substrate W surface that is patterned, the radiation is diffracted and the diffraction pattern (or spectrum) is propagated via the partial reflector BS2 and the beam splitter BS3. It is this diffraction pattern that gives information about the pattern from which it is diffracted, because each pattern will have its own unique signature that is present in the resultant spectrum.

The second radiation source S2 in the present embodiment should also be pulsed. One reason for this is so that the image acquisition is insensitive to blur caused by vibrations. A "strobe" effect causes only intermittent images to be captured so that a blur that may be caused by vibrations or other movement between images is avoided. A second reason for this pulsing of the source is that while the scatterometer detector CCD2 is acquiring the scatter spectrum of the target on the substrate, the second source S2 should be switched off or at least not project onto the substrate to prevent stray light from the LED S2 from entering the detector CCD2 and affect the measurement beam. In order to create the pulse in the radiation, the second source may be switched on and off in quick succession (which is possible with a white light LED, for instance). This can switch off the LED S2 or approximately 0.1 ms at a time, which is enough time for the scatterometer detector CCD2 to acquire enough photons for a single measurement of the spectrum from the measurement spot. Alternatively, a shutter SHUT may be used to alternately block and allow the LED light to pass, thus creating the pulse (in which case a xenon or halogen source may be used as an alternative to an LED). The shutter may, for instance, be a spinning disc with cut-out portions to allow radiation through at predetermined intervals depending on the speed of rotation of the disc. Preferably, the drive current through the LED may be pulsed with, for example, a pulse generator. Shutter SHUT may be controlled by a controller CONT and may be triggered by a signal from a timer 20.

The second light source S2 that gives a pulsed beam is used to illuminate an extended area of the measurement location, this extended area Im extending beyond the measurement spot MS created by the first light source S1. The diffracted light from the second source S2 impinges on both detectors CCD1 and CCD2, except while the light from the second source S2 is switched off as described above. However, the two detectors CCD1 and CCD2 acquire useful images at different times: the scatterometer detector CCD2 acquires only the measurement beam from the first source S1 while S2 is switched off. At intervening times, when the second source S2 is switched on, the image detector CCD1 receives the images of both the measurement spot MS and the extended area Im. As shown in FIG. 4, the non-periodic pattern 30 that is on the substrate W is imaged on the scatterometer detector CCD1 while the second source S2 is switched on. The area of the substrate that is illuminated by S2 is imaged on the CCD2 camera simultaneously with an image of the measurement spot S1 that is projected onto the substrate. The position of the measurement spot MS relative to the pattern covered by the LED will therefore be determinable using image processing techniques. The image of the target will be a low-pass filtered version of the actual pattern since the numerical aperture of the objective is finite and the wavelength of source S2 will not be very short. Moreover, aberrations in the optics will probably distort the image. As a result, the blurred and distorted image is first restored with enhancement techniques and edge detection can be used to determine the contours of the target. Edge detection may also used to determine the location of the center of the measurement spot. Finally, a position is measured between the target edges and the centre of the spot. In other words, an image of the pattern Im plus an image of the measurement spot MS is used to determine the location of the measurement spot relative to the pattern to ensure that the measurement spot is not in an incorrect area of the pattern, thereby giving an erroneous impression of what the pattern should be in that area. This information of relative position is compared with the library of parameters and positions to give the result of relative position of the measurement beam with respect to the hot-spot (for instance). This result may then be fed back into the inspection apparatus such that the result from the scatterometer detector CCD2 has information on overlay, CD, etc., and also relative position in order to have a full picture of what is being imaged. The output of both CCD1 and CCD2 is sent to a processor for the reconstruction, using the measured spectra (from CCD2) and measured spot positions (from CCD1) as input.

In other words, the scatterometer (or inspection apparatus) now has not only a spectrum of the diffracted radiation from the laser S1, but also the relative position of where the spectrum has actually come from on the pattern. The combination of position with spectrum gives an unprecedented accuracy for the structure of the pattern that is to be reconstructed. The reconstructed parameters of the hot-spot can then be used to extract process variations (such as exposure dose or focus errors) that can be corrected for by tuning appropriate parameters of the lithographic process.

There are several ways in which the information deriving from the two detectors may be used to reconstruct the structure of the pattern on the substrate accurately. Principal component analysis is a known method that may be used. Further details of this technique can be found in United States Patent Application Publication No. 2005/0185174, which document is hereby incorporated in its entirety by reference.

As indicated above, an advantage of the present apparatus is that some errors that can be overcome are caused by vibration in either the substrate or the substrate table that holds the substrate or any other piece of hardware present in the system. In order to allow the system to be insensitive to blur caused by vibrations, the acquisition time of a single frame by the detectors CCD1 and CCD2 is as short as possible and preferably less than about 1 ms.

Further to the pulse of the second source S2, during the actual acquisition of the spectrum by the scatterometer detector CCD2 that is used for CD and overlay metrology, etc., the white-light LED S2 may be switched off to avoid stray light from the LED from entering the detector CCD2 during its acquisition of the measurement beam image. To this end, the light acquisition time of the detector CCD2 may be triggered by a pulse from a timer 20, this same pulse also switching off the LED for a short duration. This duration may be of the order of 0.1 ms. It is during this short triggered pulse that the detector CCD2 acquires a sufficient number of photons for a single measurement. The system may effectively be a timing generator such that when the LED is switched off, the detector CCD2 is switched on.

The person skilled in the art will recognize several ways of implementing this timing which is represented by the timer 20 in FIG. 4.

The apparatus in FIG. 4 is used to acquire a series of spectra for various locations of the measurement spot MS with respect to the pattern 30 on the substrate W. Of course, the measurement spot is preferably situated in an area around and on a measurement hot-spot. For example, acquiring 100 spectra in a 10×10 array with pitch of 0.3 µm gives a total measured area of 3×3 µm$^2$, which is sufficient to cope with vibrations of (for example) the substrate table WT and inaccuracies of the stage positioning. Each spectrum acquisition takes approximately 1 ms so that the total acquisition time of such an example will be approximately 100 ms. This excludes time involved to move the measurement spot relative to the pattern. There are two ways in which the measurement spot MS may be moved relative to the pattern 30 on the substrate W. The first is by scanning the measurement spot by moving the source S1 and/or its related optics. This is a quicker but often less accurate method than moving the substrate table WT, which is often slower because of the weight and precision involved, but makes up for the lack in speed with an increase in accuracy because only a single object (the substrate table WT) needs to be moved and no relative optical movements of different lenses, etc., need to be moved at the same time. Furthermore, the substrate table WT is already on a scanning system as described above in order to move the substrate below the lithographic apparatus in order to allow scanning during printing or exposure or any other process required.

To improve the robustness of the measurement, spectra may be acquired at a plurality of wavelengths of the tunable laser S1 as also described.

Figure 5:
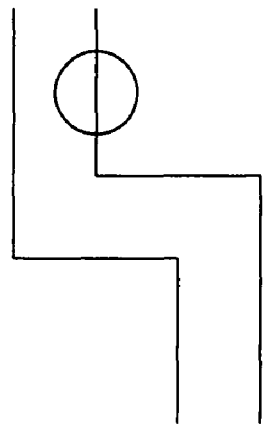
FIG. 5 depicts a series of possible measurement spot locations.
Figure 5:
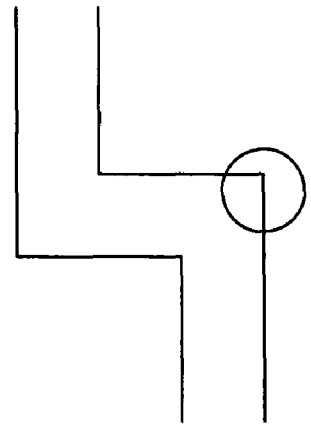
Figure 5:
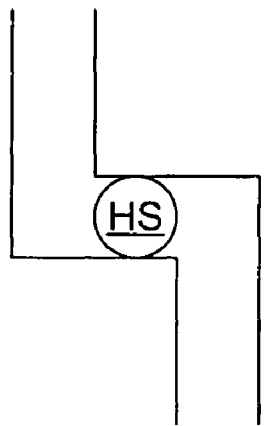
Figure 5:
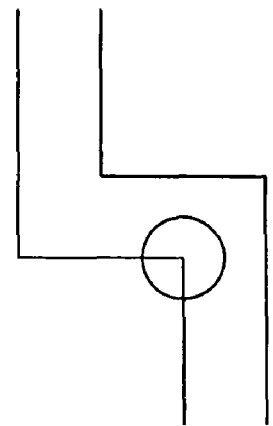

An example of the use of library-based comparison is given below. The position of a measurement spot should be given relative to something else, as this is much easier than giving a position in absolute space or an absolute x,y,z axis, and embodiments described herein give a measurement spot relative to the pattern 30 that is present on the substrate W. Using this information and a known position of a hot-spot, the measurement spot may be given relative to a known hot-spot, which may be advantageous as described above. FIG. 5 gives an example of a hot-spot HS at measurement spot C on a pattern.

In this example, theoretical measurement spots A and B as shown in FIG. 5 may be measured with respect to the hot-spot HS or with respect to the pattern shown in FIG. 5 using scatterometry or a scanning electron microscopy or other conventional methods. The relative positions of A and B with respect to either the pattern or the hot spot or both are stored in a measurement spot library. A measurement in real time of a further spot D is then carried out as shown in FIG. 5. The spectrum arising from the diffraction of the light at measurement spot D may be compared with the other known spots in the library. In this case, the spectrum will not match the other spots and in the past, this would have been an assumed error and the result of the measurement spot D would have meant a re-measurement or a correction in the patterning process or in the metrology process. However, with the present invention, the position of D relative to the entire pattern may be determined using the system of FIG. 4, and the position of measurement spot D with respect to the hot spot HS in FIG. 5 may subsequently be calculated. Measurement spot D may then also be added to the library. The relationship of measurement spot D with respect to the other measurement spots A and B may also be stored in the library. When a subsequent spectrum is found to have features similar to that of measurement spot D, for instance, the combination of the spectrum of measurement spot D with the measurement by the position-determining detector CCD1 may be used to determine the position of the measurement spot, which will be found to be in position D of FIG. 5. The position of the measurement spot from the image detector CCD1 may then be input into a calculation system along with a measurement from the scatterometer detector CCD2 and the overlay, CD, etc., of the detected measurement spot may be checked against a library of overlay, CD, etc., with confidence that there has not been an alignment error of the measurement beam.

Using this same technique, a range of parameters such as actual spot position, focus, dose, blur, overlay variations or even variations in underlying process layers may be determined.

The apparatus described herein may also be used on non-periodic features of a pattern. It is also an application of existing scatterometers. This method that combines two sources can be used where scanning electron microscopy cannot in order to find local, non-representative errors. The apparatus allows on-product, in-line metrology of CD and overlay without the need for special test patterns. The method may be much faster than, for instance, SEM and therefore may give a higher throughput. Furthermore, the apparatus and method described herein enable the metrology of two-dimensional non-periodic hot spots and of large or small hot spots. The apparatus enables nanometer accuracy of hot spots relative to a measurement position and measures not only spot position but focus, dose, blur, overlay and variations in underlying process layers.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring a property of a substrate, the method comprising:
   generating a patterned mask configured to cause a radiation beam passing through the mask to acquire a pattern;
   simulating radiating the substrate with a patterned radiation beam that has been patterned using the mask to obtain a simulated pattern;
   determining at least one location of the simulated pattern that is prone to patterning errors;
   irradiating the substrate with the patterned radiation beam using a lithographic process;
   measuring an accuracy of at least one property of the at least one location of the pattern on the substrate that has been determined as being prone to patterning errors, the measuring comprising irradiating a measurement spot with a first radiation source, irradiating a portion of the pattern on the substrate that is larger than the measurement spot with a second radiation source, and comparing relative positions of the measurement spot and the portion of the pattern that is larger than the measurement spot; and
   adjusting the lithographic process according to said measuring; and
   reconstructing a portion of the pattern within the measurement spot using an image of the pattern and the position of the measurement spot relative to the portion of the pattern.

2. A method according to claim 1, further comprising comparing diffraction patterns of a radiation beam reflected from a surface of the substrate with diffraction patterns of known substrate surface properties.

3. A method comprising:
   choosing a measurement spot corresponding to a location of a pattern that has been determined as being prone to patterning errors;
   irradiating the measurement spot on the pattern on a substrate with a first radiation source;
   irradiating, with a second radiation source, a portion of the pattern on the substrate that is larger than the measurement spot irradiated by the first radiation source;
   detecting radiation that is reflected from the measurement spot and the portion of the pattern with a first detector and outputting an image of relative positions of the measurement spot and the portion of the pattern;

comparing a position of the measurement spot with respect to the portion of the pattern and outputting a position of the measurement spot relative to the portion of the pattern;

detecting radiation from the first radiation source having been diffracted from the measurement spot using a second detector and outputting a diffraction spectrum associated with the pattern; and reconstructing the pattern within the measurement spot using an image of the pattern and the value of the position of the measurement spot relative to the portion of the pattern.

4. An inspection apparatus configured to measure a property of a substrate, the inspection apparatus comprising:

a first radiation source configured to irradiate a measurement spot on a patterned target of a substrate;

a second radiation source configured to irradiate an area of the patterned target that is larger than the measurement spot;

a first detector configured to detect (1) radiation originating from the first radiation source and having been reflected from the measurement spot, and (2) radiation originating from the second radiation source and having been reflected from the area of the patterned target that is larger than the measurement spot, and to output an image of relative positions of the measurement spot and the area of the patterned target that is larger than the measurement spot;

an image processor configured to receive the output of the first detector, to compare a position of the measurement spot with respect to the area of the patterned target, and to output a position of the measurement spot relative to the area of the patterned target;

a second detector configured to detect radiation from the first radiation source having been diffracted from the measurement spot, and to output a diffraction spectrum corresponding to the patterned target; and a processor configured to process the output of the image processor and the output of the second detector to reconstruct a pattern of the patterned target within the measurement spot.

5. The inspection apparatus according to claim 4, wherein the image processor is configured to compare the output of the first detector with stored values of measurement spot positions to determine which of the stored values most closely matches the output of the first detector, and to output a best match value.

6. The inspection apparatus according to claim 4, wherein the processor is configured to compare the output of the image processor and the output of the second detector with stored values of patterned targets in order to determine which of the stored values most closely matches the output of the second detector in conjunction with a relative position output of the image processor to obtain a best match reconstruction value.

7. The inspection apparatus according to claim 4, wherein the image processor is configured to determine a position of the measurement spot relative to a second spot on the patterned target, the second spot being a predetermined spot that is known to be sensitive to errors in production of the pattern.

8. The inspection apparatus according to claim 4, further comprising a high numerical aperture objective configured to focus a light beam from the first light source onto the patterned target of the substrate.

9. The inspection apparatus according to claim 4, wherein the measurement spot size is of the order of about 300 nm.

10. The inspection apparatus according to claim 4, further comprising a timer and controller configured to prevent the second radiation source from irradiating the substrate while the second detector is detecting diffracted radiation from the substrate such that the second detector detects only radiation from the first radiation source.

11. The inspection apparatus according to claim 4, configured to inspect a non-periodic pattern.

12. The inspection apparatus according to claim 4, further comprising a color filter between the substrate and the first detector such that a detected measurement spot is filtered.

13. The inspection apparatus according to claim 4, wherein an acquisition time of a measurement spot by the first detector is less than about 1 ms.

14. The inspection apparatus according to claim 4, further comprising a feedback system configured to switch the second radiation source off during acquisition of diffracted radiation beams by the second detector.

15. The inspection apparatus according to claim 4 wherein the second radiation source is an extended light source.

16. The inspection apparatus according to claim 4, wherein the first radiation source comprises a laser.

17. The inspection apparatus according to claim 4, wherein the second radiation source is pulsed.

18. The inspection apparatus according to claim 4, wherein the inspection apparatus is configured to acquire a series of radiation measurements for a plurality of locations of the measurement spot.

19. The inspection apparatus according to claim 14, wherein the duration of the radiation beam acquisition by the second detector, during which the second radiation source is switched off, is approximately 0.1 ms.

20. The inspection apparatus according to claim 15, wherein the second radiation source is an LED.

21. The inspection apparatus according to claim 15, wherein the second radiation source is a white-light LED.

22. The inspection apparatus according to claim 16, wherein the laser is tunable.

23. The inspection apparatus according to claim 22, wherein the laser comprises a super-continuum laser and an acousto-optic tunable filter.

24. The inspection apparatus according to claim 17, wherein the second radiation source is switched on and off in order to create the pulse.

25. The inspection apparatus according to claim 24, further comprising a shutter configured alternately to allow and to prevent radiation from the second radiation source from reaching the substrate.

26. The inspection apparatus according to claim 18, further configured to move the first radiation source in order to change a measurement spot position relative to a patterned target position.

27. The inspection apparatus according to claim 18, further configured to move the substrate in order to change a relative position of the measurement spot with respect to the patterned target.

28. The inspection apparatus according to claim 27, further comprising a substrate table configured to support a substrate, wherein the inspection apparatus is configured to scan the substrate table to move the substrate.

29. A method of measuring a property of a substrate, the method comprising:

irradiating a measurement spot on a patterned target on a substrate with a first radiation source;

irradiating, with a second radiation source, a portion of the patterned target on the substrate that is larger than the measurement spot irradiated by the first radiation source;

detecting with a first detector (1) radiation originating from the first radiation source and that is reflected from the measurement spot and, (2) radiation originating from the second radiation source and having been reflected from the portion of the patterned target that is larger than the measurement spot and, outputting an image of relative positions of the measurement spot and the portion of the patterned target that is larger than the measurement spot;

comparing a position of the measurement spot with respect to the portion of the patterned target and outputting a value of the position of the measurement spot relative to the portion of the patterned target;

detecting radiation from the first radiation source having been diffracted from the measurement spot using a second detector and outputting a diffraction spectrum associated with the patterned target; and reconstructing a pattern of the patterned target within the measurement spot using an image of the patterned target and a position of the measurement spot relative to the portion of the patterned target.

30. A lithographic apparatus configured to measure a property of a substrate, the lithographic apparatus comprising:

a first radiation source configured to irradiate a measurement spot on a patterned target of a substrate;

a second radiation source configured to irradiate an area of the patterned target that is larger than the measurement spot;

a first detector configured to detect (1) radiation originating from the first radiation source and having been reflected from the measurement spot, and (2) radiation originating from the second radiation source and having been reflected from the area of the patterned target that is larger than the measurement spot, and to output an image of relative positions of the measurement spot and the area of the patterned target that is larger than the measurement spot;

an image processor configured to receive the output of the first detector, to compare a position of the measurement spot with respect to the area of the patterned target and to output a value of the position of the measurement spot relative to the area of the patterned target;

a second detector configured to detect radiation from the first radiation source having been diffracted from the measurement spot and outputting a diffraction spectrum corresponding to the patterned target; and a processor for processing the output of the image processor and the output of the second detector to reconstruct a pattern of the patterned target within the measurement spot.

31. A lithographic cell configured to measure a property of a substrate, the lithographic cell comprising:

a first radiation source configured to irradiate a measurement spot on a patterned target of a substrate;

a second radiation source configured to irradiate an area of the patterned target that is larger than the measurement spot;

a first detector configured to detect (1) radiation originating from the first radiation source and having been reflected from the measurement spot, and (2) radiation originating from the second radiation source and having been reflected from the area of the patterned target that is larger than the measurement spot, and to output an image of relative positions of the measurement spot and the area of the patterned target that is larger than the measurement spot;

an image processor configured to receive the output of the first detector, to compare a position of the measurement spot with respect to the area of the patterned target and to output a position of the measurement spot relative to the area of the patterned target;

a second detector configured to detect radiation from the first radiation source having been diffracted from the measurement spot and outputting a diffraction spectrum corresponding to the patterned target; and a processor for processing the output of the image processor and the output of the second detector to reconstruct a pattern of the patterned target within the measurement spot.

32. A device manufacturing method, comprising:

simulating radiating a substrate with a patterned radiation beam that has been patterned using a mask to obtain a simulated pattern;

determining at least one location of the simulated pattern that is prone to patterning errors;

irradiating the substrate with the patterned radiation beam using a lithographic process;

measuring an accuracy of at least one property of the at least one location of a pattern on the substrate that has been determined as being prone to patterning errors, the measuring comprises irradiating a measurement spot with a first radiation source, irradiating a portion of the pattern on the substrate that is larger than the measurement spot with a second radiation source, and comparing relative positions of the measurement spot and the portion of the pattern that is larger than the measurement spot; and adjusting the lithographic process according to said measuring; and reconstructing a pattern within the measurement spot using an image of the pattern and the position of the measurement spot relative to the portion of the pattern that is larger than the measurement spot.

33. The method according to claim 32, further comprising: projecting the patterned radiation beam onto a target portion of the substrate after said adjusting.

* * * * *